United States Patent [19]

Dean et al.

[11] Patent Number: 4,721,907
[45] Date of Patent: Jan. 26, 1988

[54] APPARATUS FOR AUTOMATED TESTING OF SURFACE MOUNTED COMPONENTS

[75] Inventors: Weibley J. Dean; Paul M. Overby, both of Binghamton; Robert R. Rohde, Apalachin, all of N.Y.

[73] Assignee: Universal Instruments Corporation, Binghamton, N.Y.

[21] Appl. No.: 693,987

[22] Filed: Jan. 23, 1985

[51] Int. Cl.$^4$ .................... G01R 1/06; G01R 31/02
[52] U.S. Cl. .................... 324/158 F; 324/73 PC; 324/158 P
[58] Field of Search .............. 324/158 P, 72.5, 73 PC, 324/158 F; 198/394, 345

[56] References Cited

U.S. PATENT DOCUMENTS

| | | | |
|---|---|---|---|
| 3,333,274 | 7/1967 | Forcier | 324/158 P |
| 3,344,900 | 10/1967 | Drop | 198/394 X |
| 4,532,423 | 7/1985 | Tojo et al. | 324/158 F |
| 4,574,235 | 3/1986 | Kelly et al. | 324/158 P |
| 4,590,422 | 5/1986 | Milligan | 324/158 F |

Primary Examiner—Reinhard J. Eisenzopf
Assistant Examiner—Vinh P. Nguyen
Attorney, Agent, or Firm—Franklin D. Wolffe; Morris Fidelman

[57] ABSTRACT

The novel tester comprises jaws for orienting the component about a longitudinal axis of the tester in order to ensure proper positioning of the electrical connectors for engagement by test contacts of the tester. Each component usually has a mounting surface for engaging a dot of glue by which the component is held to the circuit board, and the novel tester provides means for generally preventing tilting of this mounting surface relative to longitudinal axis of the tester during testing.

3 Claims, 7 Drawing Figures

APPARATUS FOR AUTOMATED TESTING OF SURFACE MOUNTED COMPONENTS

BACKGROUND AND SUMMARY OF THE INVENTION

The invention is directed to an apparatus for squaring an electrical component and testing electrical functioning of the component, particularly in preparation for mounting of the component to a printed circuit board (PCB) by insertion or surface mounting in an automated process.

Insertion, as the name implies, generally involves inserting the leads of a component through the holes of the circuit board and clinching protruding portions of the inserted leads to the underside of the board so as to hold the component in preparation for subsequent soldering of the leads to electrical tracks of the board.

Surface mounting generally involves surface mounting of miniature components, without the need for lead receiving holes at the mounting locations of the circuit board, as by using a dot of glue to hold the component in preparation for subsequent soldering of electrical connectors of the component to the electrical tracks. The thickness of these surface mounted components generally range from 0.018–0.62 inches, with width and length dimensions perpendicular to the thickness generally ranging from 0.040–0.250 inches. The electrical connectors of surface mounting components may comprise: conductive pads which are generally flush with the component body; hemispherical conductive balls; and/or conductive leads protruding from the body. The tips of the protruding conductive leads may extend past or be generally flush with the component body "mounting surface" which generally is parallel to the circuit board top surface when mounted. Since the glue used to hold the surface mounted component in place does not "set-up" right away, components with lead tips extending past the mounting surface were being propelled free of the unset glue by the spring force stored in the leads during placement of the component onto the dot of glue. Hence, the leads of some components have been shortened so that the tips of the leads are generally coplanar with the mounting surface of the component, thus eliminating such "popping" of the components from the circuit board.

Prior attempts to test such surface mounted components automatedly have provided devices which have been unable to reliably handle all of the above-noted electrical connectors. One such prior art device could handle only leadless (conductive pad) components. With another prior art device, components having lead tips generally coplanar with the mounting surface of the component would need to be pressed so firmly onto test contacts and the component would be damaged and/or lateral positioning of the leads relative to the testing contacts would be lost, resulting in unreliable testing.

It is an object of the instant invention to provide an improved tester which provides reliable, repeatable testing of electrical functioning of surface mountable electrical components having various electrical connector configurations as noted above, and which particularly may be part of an automated processing line.

The novel tester comprises jaws for orienting the component about a longitudinal axis of the tester in order to ensure proper positioning of the electrical connectors for engagement by test contacts of the tester. Each component usually has a mounting surface engageable with a dot of glue to hold the component on the circuit board, and the novel tester provides means for generally preventing tilting of this mounting surface relative to the tester longitudinal axis.

DETAILED DESCRIPTION OF THE INVENTION

Figure 3:
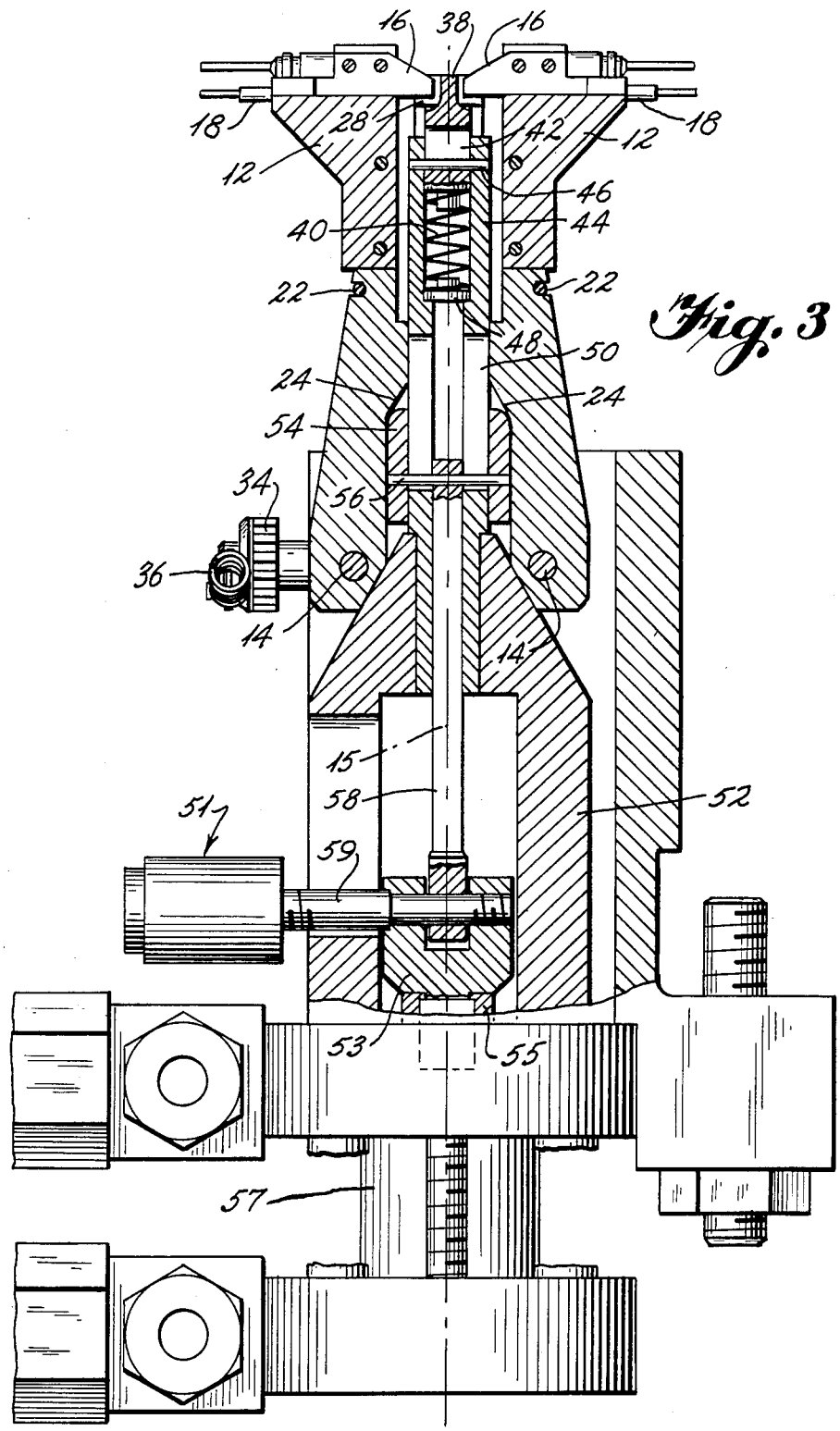
FIG. 3 is a cross sectional view generally in the direction of arrows A—A of FIG. 2.

Referring to the drawings, the improved tester comprises a body 52 to which a pair of squaring arms 26 are pivotally connected for rotation by the pins 27, and test arms 12 are pivotally connected for rotation around pins 14. Centrally located relative to arms 12 and 26 and longitudinal axis 14 of the device is a component engaging platform 38. Platform 38 is telescopic within a guide tube 44, with the limits of such telescoping being defined by pin 46 and slot 42, as seen in FIG. 3. Platform 38 is biased to the upward position of FIG. 3 by compression spring 40 being sandwiched between the lower end of platform 38 and a plug 48 fitted into guide tube 44. A generally cylindrical member 54 has camming surfaces on the top portion thereof and is telescopic over the outside surface of guide tube 44 according to actuation of a cylinder 57. The upper and lower limits of movement of cam 54 are defined by a slot 50 of guide tube 44 and a pin 56 reciprocatable within slot 50 by attachment to a driving rod 58. Driving rod 58, in turn, is connected to a piston 55 of cylinder 57 at clevis 53 by a pin 59, an outer end of which extends through a slot in body 52 of the tester and supports the magnet 51 of a Hall effect position sensor.

Figure 4:
FIG. 4 is an enlarged view, partially in section, of a plunger-type electrical contact utilized in the tester.

Squaring arms 26 have camming surfaces 32 (seen in FIG. 2), and test arms 12 have cam surfaces 24, with the positioning of cam surfaces 24 and 32 being axially spaced along longitudinal axis 14 in order that squaring arms 26 close upon a component 2 prior to engagement of the electrical connectors thereof by test contacts 16, 18 of the test arms 12. As may be appreciated from the figures, cam 54 provides for positive control of opening of the squaring and testing arms, with springs 22 and 30 biasing arms 12, and 26, respectively, to the closed position relative to longitudinal axis 14. Squaring arms 26 are provided with electrically insulative squaring inserts 28 in order to prevent short circuiting between leads of the components, whereas test arms 12 are provided with electrically conductive test probes 16 and 18. At least one of the opposed test arms 12 has a blade-type electrical contact 16 and the other test arm 12 has at least two spring biased, plunger-type contacts of the type illustrated in FIG. 4. Alternatively, one or both arms may have a blade type test probe 16 which is flanked on each side by a spring biased, plunger-type probe 18.

In the preferred embodiment of the invention, each arm 12 has a blade-type test contact 16 so that components such as resistors and capacitors which have electrical connectors on opposite ends of the component may be tested via the blade-type contacts 16. In order to test small outline transistor (SOT) components having two electrical connectors on one side of the device and one connector on the other side of the device which is offset between the first two electrical connectors, the preferred embodiment also has two of the plunger-type contacts 18 (of FIG. 4) on one of the arms 12. Of course, both test arms 12 may have the full compliment of test contacts 16 and 18 in order that components which are 180° out of orientation around axis 15 may also be tested.

Figure 1:
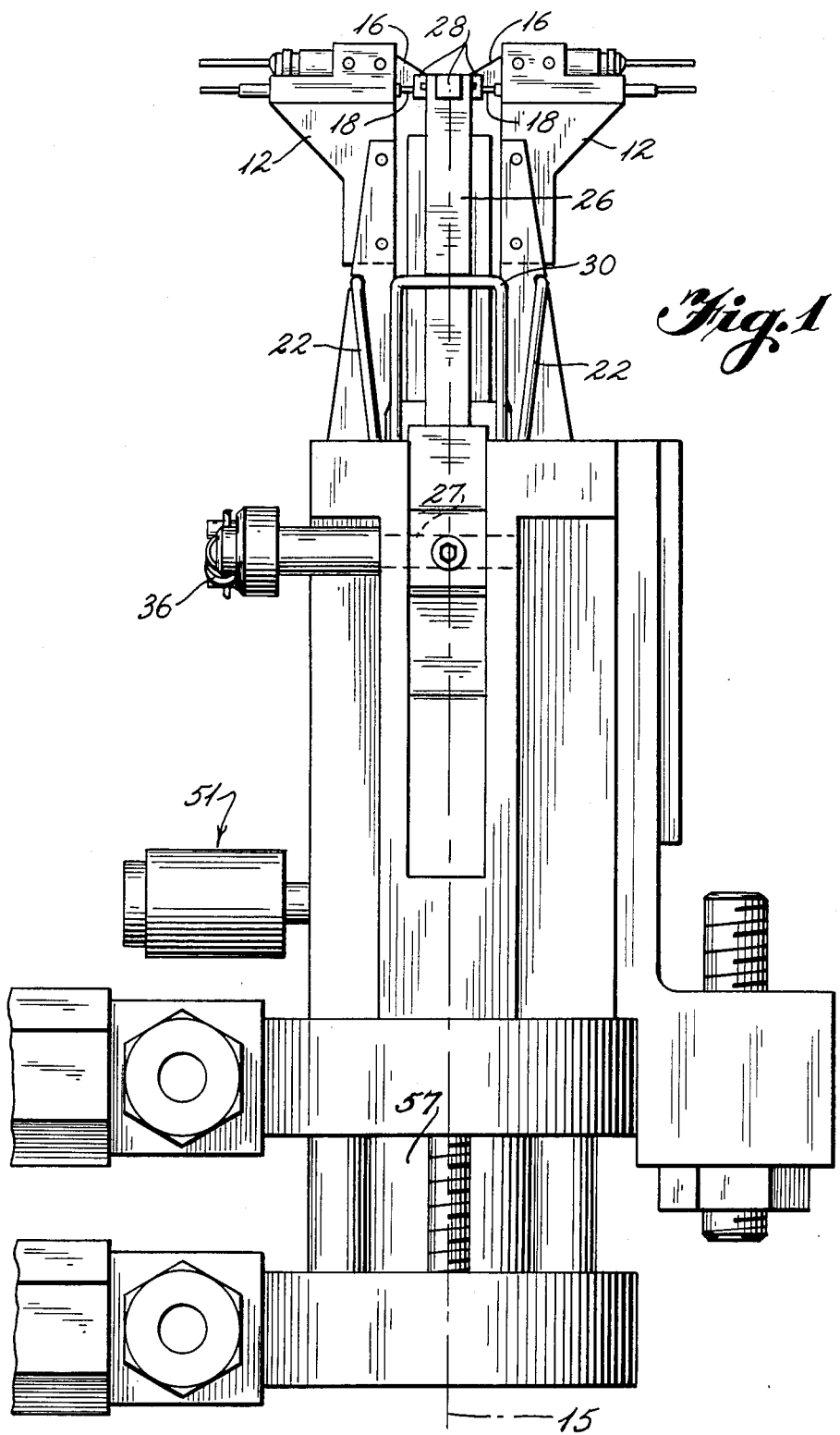
FIG. 1 is a front elevation of the squarer and tester.
Figure 2:
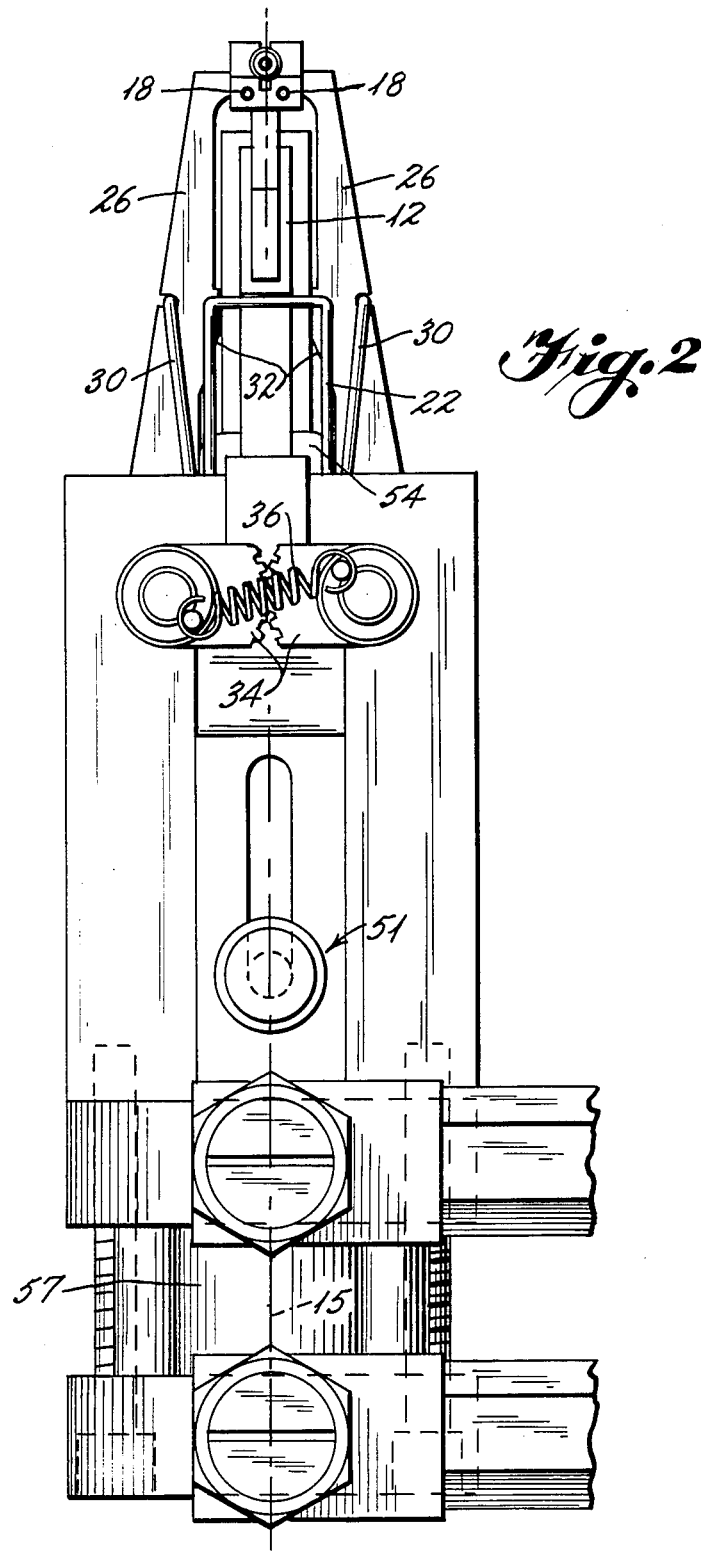
FIG. 2 is a left side elevation of the device of FIG. 1.

Gears 34 are attached to their corresponding squaring arms 26 by pins 27 in order to rotate therewith, with gears 34 meshing so that arms 26 open and close in concert to center the component along the line of closing of arms 26. As seen in FIG. 2, spring 36 is attached to gear 34 in order to take the backlash out of a sloppy gear engagement and account for any tolerance in the holes by which gear 34 are mounted on pins 27. In a prototype of the instant invention, springs 22 on test fingers 12 are sufficiently heavier than springs 30 on squaring arms 26 for the purpose of overcoming friction on the component from the spring load of the plunger-type electrical contacts 18 mounted thereon. Of course, various combinations of the contacts 16, 18 are activated according to the components being tested.

Test arms 12, unlike squaring arms 26, are allowed to somewhat "float" relative to axis 14 so that, if a component is not exactly along their line of closing, engagement of a component by one arm 12 does not prevent engagement by the other arm 12. Component bodies sometimes have burs which can cause the component to "hang-up" on a squarer face 28 so that positive engagement between arms 12, as with gears 34 of arms 26, would prevent proper engagement with both arms 12 when one of the arms 12 engaged a component off-center along their line of closing. Such burs also could groove the insulated surfaces 28 of squaring arms 26 if test arms 12 were allowed to exactly center the component upon axis 14. Grooving of squaring arm 28, consequently, could prevent proper centering of the component along the line of closing of arms 26 so that the electrical connectors of some surface mounted components would not be properly contacted by the test probes 16 and 18 upon closing of test arms 12. Floating of arms 12 negates both of these problems.

Figure 6A:
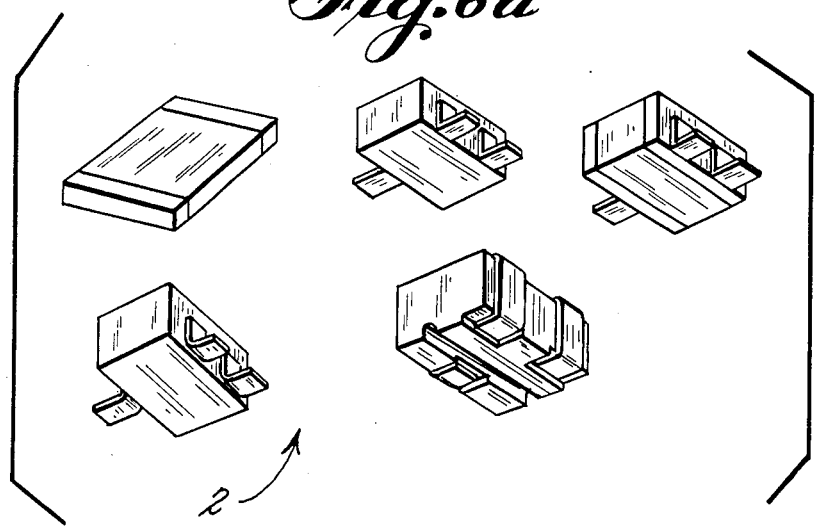
FIG. 6A is a view illustrating various electrical components which may be tested by the instant invention.
Figure 6B:
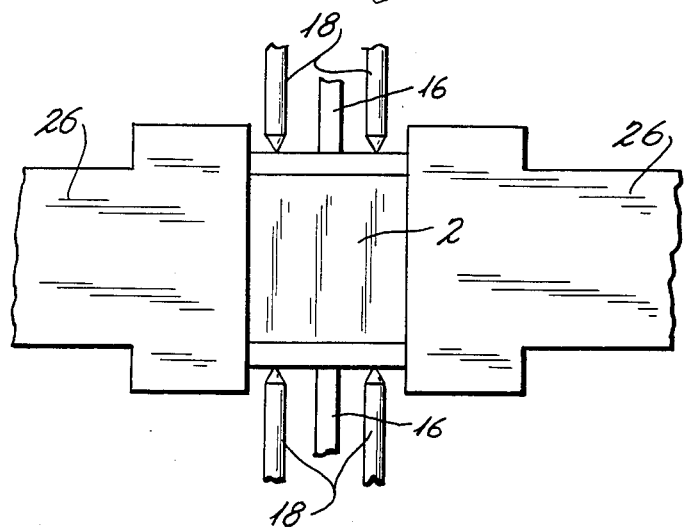
FIG. 6B is an enlarged partial view of the squaring and testing arms with an electrical component therein.
Figure 5:
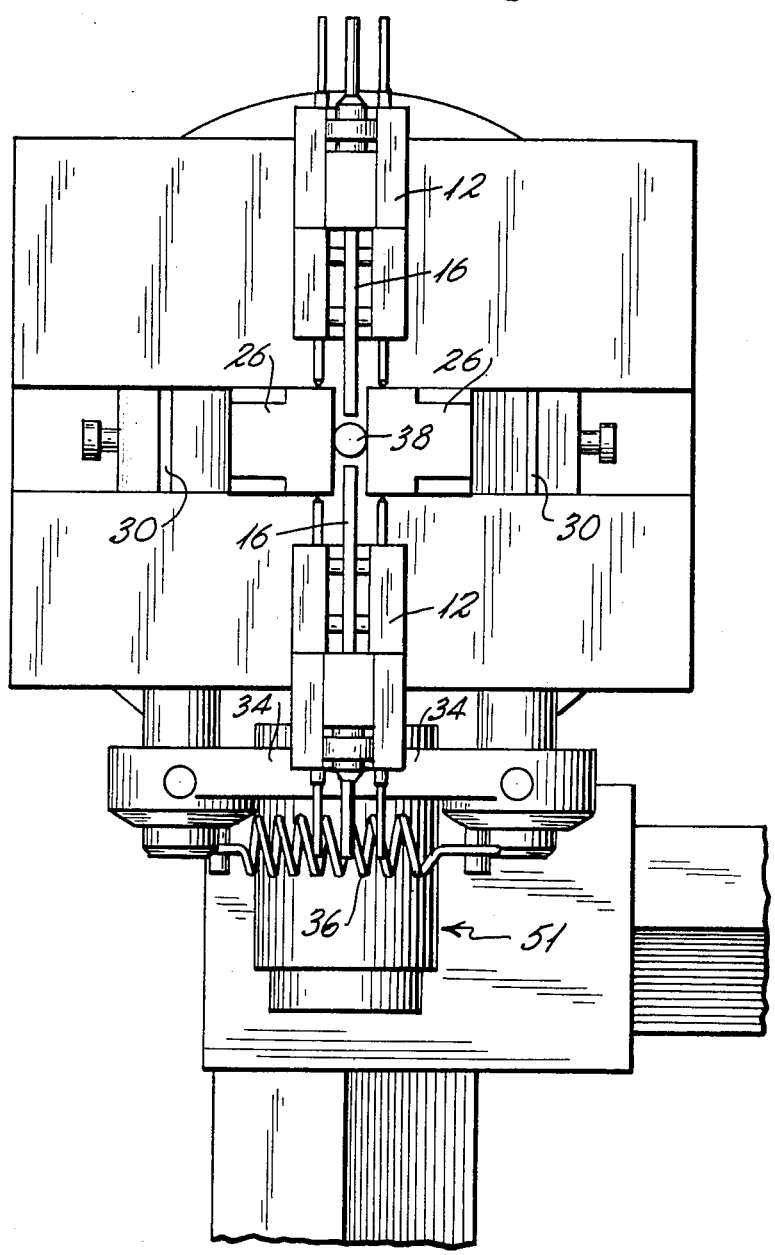
FIG. 5 is a top plan view of the device of FIG. 3.

In operation, test arms 12 and squaring arms 26 are opened by cam 54 during extension of piston 55 by cam 57, and a component such as illustrated in FIG. 6 engages platform 38 and depresses platform 38 against the bias of spring 40 to a depth generally equal to the thickness of the component. At this time, cylinder 57 is fired to retract piston rod 55 thus allowing closing of squaring arms 26 and test arms 12, in that order. Electrical function testing of the device is carried out at this time according to connection of contacts 16 and 18 to a programmable test circuit via electrical leads (not shown). After testing of the component, arms 12 and 26 are again opened by cam 56 for removal of the component and subsequent handling thereof according to the results of the test. It was discovered that components would become tilted relative to longitudinal axis 14 without provision of the spring bias platform 38, thus resulting in an improper test. By incorporation of platform 38 into the device, such tilting has been obviated.

It will thus be seen that the objects set forth above, among those made apparent from the preceding description, are efficiently attained and, since certain changes may be made in the construction set forth without departing from the scope of the invention, it is intended that all matter contained in the above description or shown in the accompanying drawings shall be interpreted as illustrative and not in a limiting sense.

It is also to be understood that the following claims are intended to cover all of the generic and specific features of the invention herein described, and all statements of the scope of the invention which, as a matter of language, might be said to fall therebetween.

We claim:

1. A tester for testing electrical functioning of surface mounted-type electrical components prior to mounting of said components on a circuit board, each of said components comprising a body and electrically conductive connectors, said tester having a longitudinal axis and comprising:
   means for orienting said component body angularly about and transverse to said longitudinal axis in preparation for said testing, and said orienting means comprising a pair of arms closeable upon said component body and each having a component body engaging surface sufficient for rotating said body about an axis generally parallel to said longitudinal axis in order to provide said angular and transverse orienting of said body;
   means, operatively associated with said orienting means, for engaging said electrical connectors conductively in order to perform electrical functioning testing thereof; and
   means for actuating said body orienting and electrical connector engaging means;
   whereby said electrical connectors are elements of a set, said elements comprising conductive pads which are generally flush with a surface of the component body, conductive pads which are slightly out of flush with the component body surface, and electrically conductive leads protruding from at least one surface of a component body so as to provide lead tips generally coplanar with and spaced from another surface of said body, and said engaging means are adapted for engaging said elements.

2. A tester as in claim 1, and further comprising:
   means for engaging said component during receiving of said body by said tester and preventing tilting of said component relative to said longitudinal axis, in order that said electrical connectors are properly positioned for said electrical connectors engaging means.

3. A tester as in claim 1, wherein said electrical connectors engaging means comprises:
   another pair of arms, said other pair being closeable upon said electrical connectors.

* * * * *